(12) United States Patent
Chang et al.

(10) Patent No.: US 9,647,048 B2
(45) Date of Patent: May 9, 2017

(54) CAPACITOR STRUCTURES FOR DISPLAY PIXEL THRESHOLD VOLTAGE COMPENSATION CIRCUITS

(71) Applicant: Apple Inc., Cupertino, CA (US)

(72) Inventors: Shih Chang Chang, Cupertino, CA (US); Vasudha Gupta, Cupertino, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/315,202

(22) Filed: Jun. 25, 2014

(65) Prior Publication Data

US 2015/0144892 A1    May 28, 2015

Related U.S. Application Data

(60) Provisional application No. 61/909,303, filed on Nov. 26, 2013.

(51) Int. Cl.
*H01L 27/32* (2006.01)
*G09G 3/32* (2016.01)
*G09G 3/3233* (2016.01)

(52) U.S. Cl.
CPC ....... *H01L 27/3265* (2013.01); *G09G 3/3233* (2013.01); *H01L 27/3262* (2013.01); *G09G 2300/0426* (2013.01); *G09G 2300/0819* (2013.01); *G09G 2300/0852* (2013.01); *G09G 2300/0861* (2013.01); *G09G 2320/043* (2013.01)

(58) Field of Classification Search
CPC ............ H01L 27/3265; H01L 27/3262; G09G 3/3233; G09G 2300/0426; G09G 2300/0819; G09G 2300/0852; G09G 2300/0861; G09G 2320/043
See application file for complete search history.

(56) References Cited

U.S. PATENT DOCUMENTS 7,112,820 B2    9/2006  Chang et al.
7,427,833 B2    9/2008  Fish et al.
8,436,357 B2    5/2013  Lee et al.
(Continued)

FOREIGN PATENT DOCUMENTS

CN         1568494        1/2005
CN         1577453        2/2005
(Continued)

*Primary Examiner* — Steven Loke
*Assistant Examiner* — Juanita Rhodes
(74) *Attorney, Agent, or Firm* — Treyz Law Group, P.C.; G. Victor Treyz; Michael H. Lyons

(57) ABSTRACT

A display may have an array of organic light-emitting diode display pixels. Each display pixel may have a light-emitting diode that emits light under control of a thin-film drive transistor. Each display pixel may have thin-film transistors and capacitor structures that form a circuit for compensating the drive transistor for threshold voltage variations. The capacitor structures may be formed from interleaved stacked conductive plates. The conductive plates may be formed from layers of material that are used in forming the drive transistor and other thin-film transistors such as a semiconductor layer, a first metal layer, a second metal layer, a third metal layer, and interposed dielectric layers.

19 Claims, 9 Drawing Sheets

(56) References Cited

U.S. PATENT DOCUMENTS

| | | | |
|---|---|---|---|
| 8,471,836 B2 | 6/2013 | Lee et al. | |
| 8,546,807 B2 | 10/2013 | Werne et al. | |
| 2004/0029338 A1* | 2/2004 | Yamazaki | H01L 27/1237 438/202 |
| 2008/0017860 A1* | 1/2008 | Kubota | H01L 27/3244 257/59 |
| 2011/0025659 A1 | 2/2011 | Kwak et al. | |
| 2013/0147692 A1* | 6/2013 | Yamashita | G09G 3/3233 345/76 |
| 2013/0337596 A1* | 12/2013 | Hung | H01L 51/56 438/34 |
| 2014/0104527 A1* | 4/2014 | Yang | H01L 27/1225 349/43 |
| 2014/0124754 A1* | 5/2014 | Park | G09G 3/32 257/40 |
| 2014/0239270 A1* | 8/2014 | Ko | H01L 27/1255 257/40 |

FOREIGN PATENT DOCUMENTS

| | | |
|---|---|---|
| CN | 101897025 | 11/2010 |
| CN | 103280182 | 9/2013 |
| CN | 103311309 | 9/2013 |

\* cited by examiner

CAPACITOR STRUCTURES FOR DISPLAY PIXEL THRESHOLD VOLTAGE COMPENSATION CIRCUITS

This application claims the benefit of provisional patent application No. 61/909,303, filed Nov. 26, 2013, which is hereby incorporated by reference herein in its entirety.

BACKGROUND

This relates generally to electronic devices with displays and, more particularly, circuitry for displays such as organic-light-emitting diode displays.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

Variations in transistor threshold voltages and other characteristics can lead to undesired visible display artifacts. Threshold voltage compensation circuitry may be used to compensate for threshold voltage variations and thereby enhance display performance. Threshold voltage compensation circuitry includes thin-film transistors and capacitors. If care is not taken, the structures used to implement capacitors and other devices in threshold voltage compensation circuitry and other display circuitry can adversely affect device performance. For example, if a storage capacitor in a threshold voltage compensation circuit exhibits a capacitance value that is too small, leakage currents may dissipate stored charges prematurely. If the storage capacitor consumes excessive circuit real estate, it may not be possible to achieve a desired pixel pitch in a display.

It would therefore be desirable to be able to provide improved threshold voltage compensation circuit capacitors and other structures for use in display circuitry in an organic light-emitting diode display.

SUMMARY

A display may have an array of display pixels. Each display pixel may have a light-emitting diode such as an organic light-emitting diode that emits light under control of a drive transistor. The drive transistor may have an associated threshold voltage.

Each display pixel may have thin-film transistors and capacitor structures that form a circuit for compensating the drive transistor for threshold voltage variations. The capacitor structures may be formed from interleaved sets of conductive plates. The conductive plates may be formed from layers of material that are used in forming the thin-film transistors such as a semiconductor layer, a first metal layer, a second metal layer, a third metal layer, and interposed dielectric layers.

DETAILED DESCRIPTION

Figure 1:
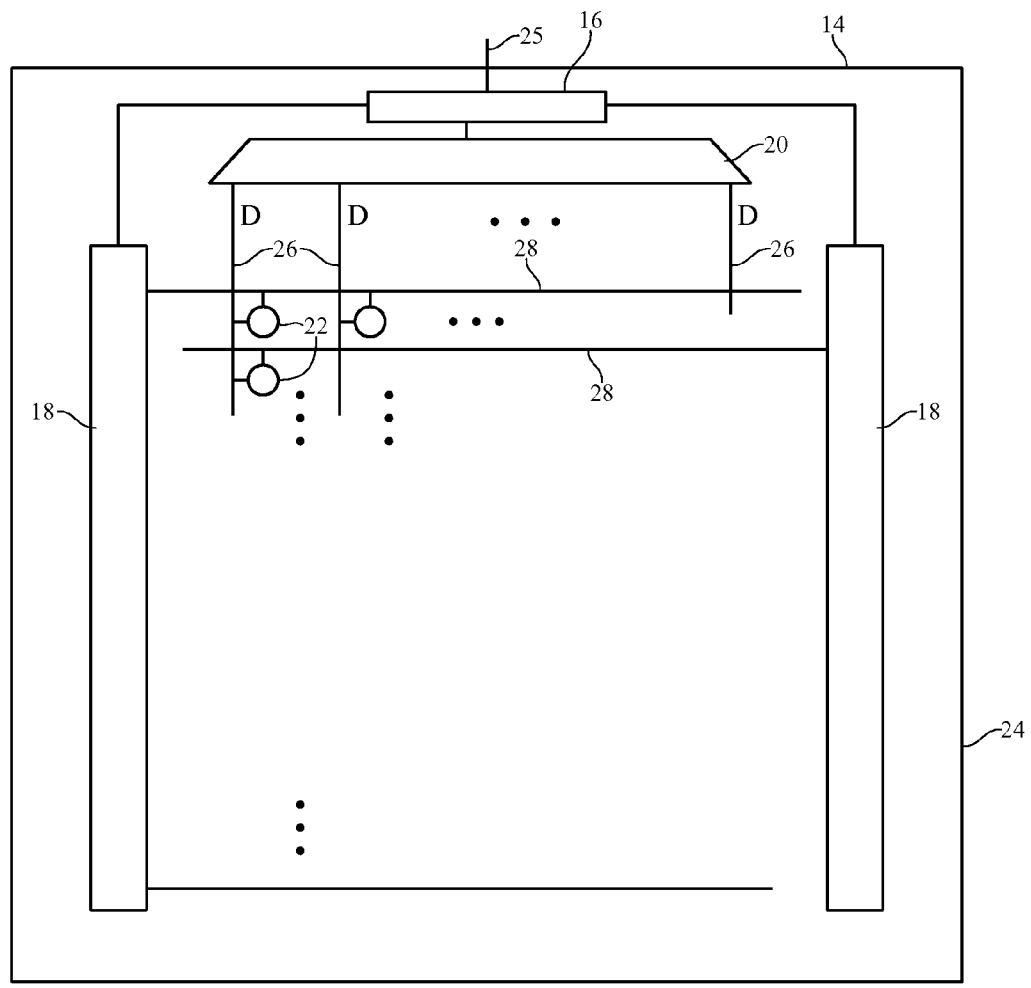
FIG. 1 is a diagram of an illustrative display such as an organic light-emitting diode display having an array of organic light-emitting diode display pixels in accordance with an embodiment.

A display in an electronic device may be provided with driver circuitry for displaying images on an array of display pixels. An illustrative display is shown in FIG. 1. As shown in FIG. 1, display 14 may have one or more layers such as substrate 24. Layers such as substrate 24 may be formed from planar rectangular layers of material such as planar glass layers. Display 14 may have an array of display pixels 22 for displaying images for a user. The array of display pixels 22 may be formed from rows and columns of display pixel structures on substrate 24. These structures may include thin-film transistors such as polysilicon thin-film transistors, semiconducting oxide thin-film transistors, etc. There may be any suitable number of rows and columns in the array of display pixels 22 (e.g., ten or more, one hundred or more, or one thousand or more).

Display driver circuitry such as display driver integrated circuit 16 may be coupled to conductive paths such as metal traces on substrate 24 using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The control circuitry may be located on a main logic board in an electronic device such as a cellular telephone, computer, television, set-top box, media player, portable electronic device, or other electronic equipment in which display 14 is being used. During operation, the control circuitry may supply display driver integrated circuit 16 with information on images to be displayed on display 14. To display the images on display pixels 22, display driver integrated circuit 16 may supply clock signals and other control signals to display driver circuitry such as row driver circuitry 18 and column driver circuitry 20. Row driver circuitry 18 and/or column driver circuitry 20 may be formed from one or more integrated circuits and/or one or more thin-film transistor circuits.

Row driver circuitry 18 may be located on the left and right edges of display 14, on only a single edge of display 14, or elsewhere in display 14. During operation, row driver circuitry 18 may provide control signals on horizontal lines 28 (sometimes referred to as row lines or scan lines). Row driver circuitry may sometimes be referred to as scan line driver circuitry.

Column driver circuitry 20 may be used to provide data signals D from display driver integrated circuit 16 onto a plurality of corresponding vertical lines 26. Column driver circuitry 20 may sometimes be referred to as data line driver circuitry or source driver circuitry. Vertical lines 26 are sometimes referred to as data lines. During compensation operations, column driver circuitry 20 may use vertical lines 26 or other lines may be used by the display driver circuitry of display 14 to supply a reference voltage or other signals to pixels 22. During programming operations, display data is loaded into display pixels 22 using lines 26.

Each data line 26 is associated with a respective column of display pixels 22. Sets of horizontal signal lines 28 run horizontally through display 14. Each set of horizontal signal lines 28 is associated with a respective row of display pixels 22. The number of horizontal signal lines in each row may be determined by the number of transistors in the display pixels 22 that are being controlled independently by the horizontal signal lines. Display pixels of different configurations may be operated using different numbers of control lines, power supply lines, data lines, etc.

Row driver circuitry 18 may assert control signals on the row lines 28 in display 14. For example, driver circuitry 18 may receive clock signals and other control signals from display driver integrated circuit 16 and may, in response to the received signals, assert control signals in each row of display pixels 22. Rows of display pixels 22 may be processed in sequence, with processing for each frame of image data starting at the top of the array of display pixels and ending at the bottom of the array (as an example). While the scan lines in a row are being asserted, the control signals and data signals that are provided to column driver circuitry 20 by circuitry 16 direct circuitry 20 to demultiplex and drive associated data signals D onto data lines 26 so that the display pixels in the row will be programmed with the display data appearing on the data lines D. The display pixels can then display the loaded display data.

In an organic light-emitting diode display such as display 14, each display pixel contains a respective organic light-emitting diode for emitting light. A drive transistor controls the amount of light output from the organic light-emitting diode. Control circuitry in the display pixel is configured to perform threshold voltage compensation operations so that the strength of the output signal from the organic light-emitting diode is proportional to the size of the data signal loaded into the display pixel while being independent of the threshold voltage of the drive transistor.

Figure 2:
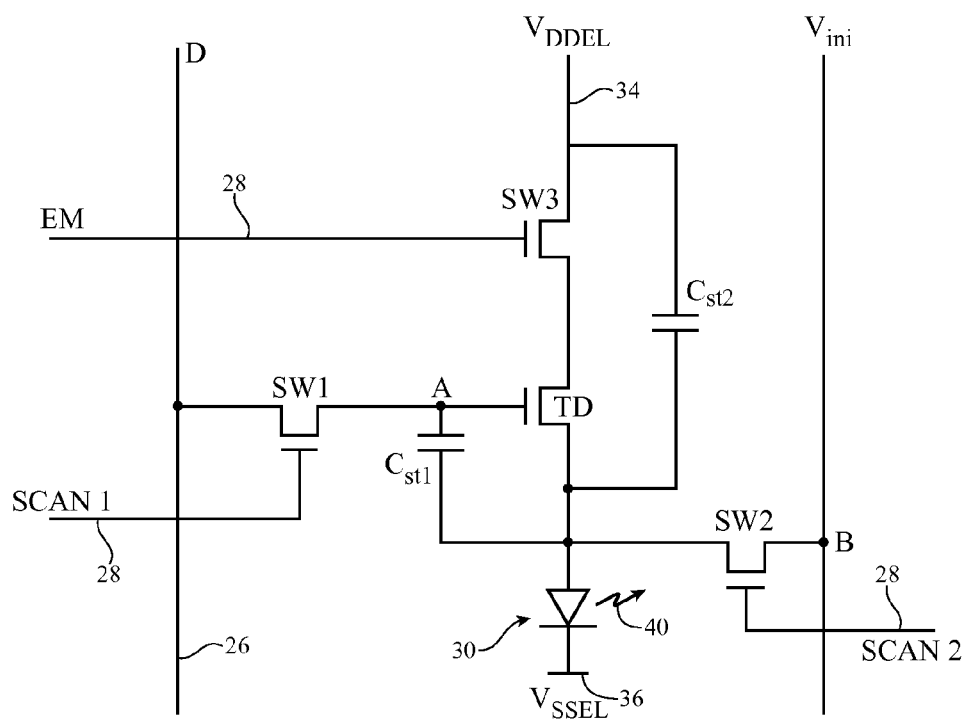
FIG. 2 is a diagram of an illustrative organic light-emitting diode display pixel of the type that may be used in a display in accordance with an embodiment.

A schematic diagram of an illustrative organic light-emitting diode display pixel 22 is shown in FIG. 2. The configuration of display pixel 22 of FIG. 2 is merely illustrative. In general, the circuitry of display pixel 22 may have any suitable number of thin-film transistors, any suitable number of storage capacitors, any suitable number of power supply voltage terminals, and any suitable number of terminals for receiving control signals, reference voltages, data input, etc.

As shown in the illustrative display pixel circuitry of FIG. 2, display pixel 22 may include light-emitting diode 30. A positive power supply voltage Vddel may be supplied to positive power supply terminal 34 and a ground power supply voltage Vssel may be supplied to ground power supply terminal 36. The state of drive transistor TD controls the amount of current flowing through diode 30 and therefore the amount of emitted light 40 from display pixel 22.

Display pixel 22 may have storage capacitors Cst1 and Cst2 and one or more transistors that are used as switches such as transistors SW1, SW2, and SW3. Control signals such as signal EM and scan signals SCAN1 and SCAN2 are provided to a row of display pixels 22 using row lines 28. Data D is provided to a column of display pixels 22 via data lines 26.

Signal EN is used to control the operation of emission transistor SW3. Transistor SW1 is used to apply the voltage of data line 26 to node A, which is connected to the gate of drive transistor TD. Transistor SW2 is used to apply a direct current (DC) bias voltage Vini to node B for circuit initialization during compensation operations.

During compensation operation, display pixels 22 are compensated for pixel-to-pixel variations such as transistor threshold voltage variations. The compensation period includes an initialization phase and a threshold voltage generation phase. Following compensation (i.e., after the compensation operations of the compensation period have been completed), data is loaded into the display pixels. The data loading process, which is sometimes referred to as data programming, takes place during a programming period. In a color display, programming may involve demultiplexing data and loading demultiplexed data into red, green, and blue pixels.

Following compensation and programming (i.e., after expiration of a compensation and programming period), the display pixels of the row may be used to emit light. The period of time during which the display pixels are being used to emit light (i.e., the time during which light-emitting diodes 30 emit light 40) is sometimes referred to as an emission period.

During the initialization phase, circuitry 18 asserts SCAN1 and SCAN2 (i.e., SCAN1 and SCAN2 are taken high). This turns on transistors SW1 and SW2 so that a reference voltage signal Vref and an initialization voltage signal Vini are applied to nodes A and B, respectively. During the threshold voltage generation phase of the compensation period, signal EM is asserted and switch SW3 is turned on so that current flows through drive transistor TD to charge up the capacitance at node B. As the voltage at node B increases, the current through drive transistor TD will be reduced because the gate-source voltage Vgs of drive transistor TD will approach the threshold voltage Vt of drive transistor TD. The voltage at node B will therefore go to Vref−Vt. After compensation (i.e., after initialization and threshold voltage generation), data is programmed into the compensated display pixels. During programming, emission transistor SW3 is turned off by deasserting signal EM and a desired data voltage D is applied to node A using data line 26. The voltage at node A after programming is display data voltage Vdata. The voltage at node B rises because of coupling with node A. In particular, the voltage at node B is taken to Vref−Vt+(Vdata−Vref)*K, where K is equal to Cst1/(Cst1+Cst2+Coled), where Coled is the capacitance associated with diode 30.

After compensation and programming operations have been completed, the display driver circuitry of display 14 places the compensated and programmed display pixels into the emission mode (i.e., the emission period is commenced). During emission, signal EM is asserted for each compensated and programmed display pixel to turn on transistor SW3. The voltage at node B goes to Voled, the voltage associated with diode 30. The voltage at node A goes to Vdata+(Voled−(Vref−Vt)−(Vdata−Vref)*K. The value of Vgs−Vt for the drive transistor is equal to the difference between the voltage Va of node A and the voltage Vb of node B. The value of Va−Vb is (Vdata−Vref)*(1−K), which is independent of Vt. Accordingly, each display pixel 22 has been compensated for threshold voltage variations so that the amount of light 40 that is emitted by each of the display pixels 22 in the row is proportional only to the magnitude of the data signal D for each of those display pixels.

Satisfactory operation of a threshold voltage compensation circuit of the type shown in FIG. 2 or other suitable threshold voltage compensation circuits for display pixels 22 involves the use of storage capacitors. If a storage capacitor exhibits a capacitance value that is too small, transistor leakage currents will discharge the capacitor prematurely. The capacitor will therefore not be able to hold a desired voltage effectively as needed to perform compensation operations. Capacitance can be increased by increasing the surface area of capacitor electrode structures, but care should be taken not to consume excessive area. If too much surface real estate is consumed by the storage capacitors in the display pixels, there will be insufficient room for other components on display 14 and it may not be possible to form compact display pixels to implement high pixel pitch displays.

Figure 3:
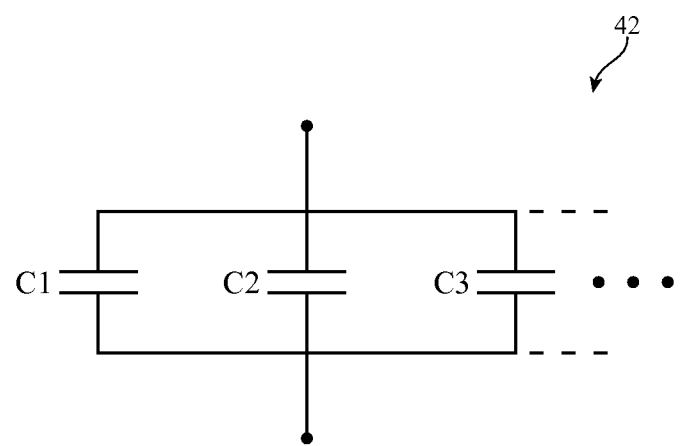
FIG. 3 is a circuit diagram of an illustrative capacitor for a threshold voltage compensation circuitry in a display in accordance with an embodiment.

An illustrative technique for enhancing the capacitance of the storage capacitors in display pixels 22 is shown in FIG. 3. As shown in FIG. 3, capacitor 42 is formed from multiple capacitors C1, C2, C3 . . . that have been connected in parallel. In this type of configuration, the total capacitance of capacitor 42 will be equal to the sum of the parallel capacitances that make up capacitor 42. For example, if capacitor 42 includes three parallel capacitances C1, C2, and C3, the capacitance of capacitor 42 will be equal to C1+C2+C3.

Capacitors such as capacitor 42 of FIG. 3 may be used in display 14. For example, capacitor 42 may be used as a display pixel storage capacitor. Capacitor 42 may, as an example, be used in implementing storage capacitor Cst1 of FIG. 2, storage capacitor Cst2 of FIG. 2, a storage capacitor that serves as the sole storage capacitor in a single-capacitor display pixel threshold voltage compensation circuit, or other capacitor in display pixels 22 of FIG. 1.

Figure 4:
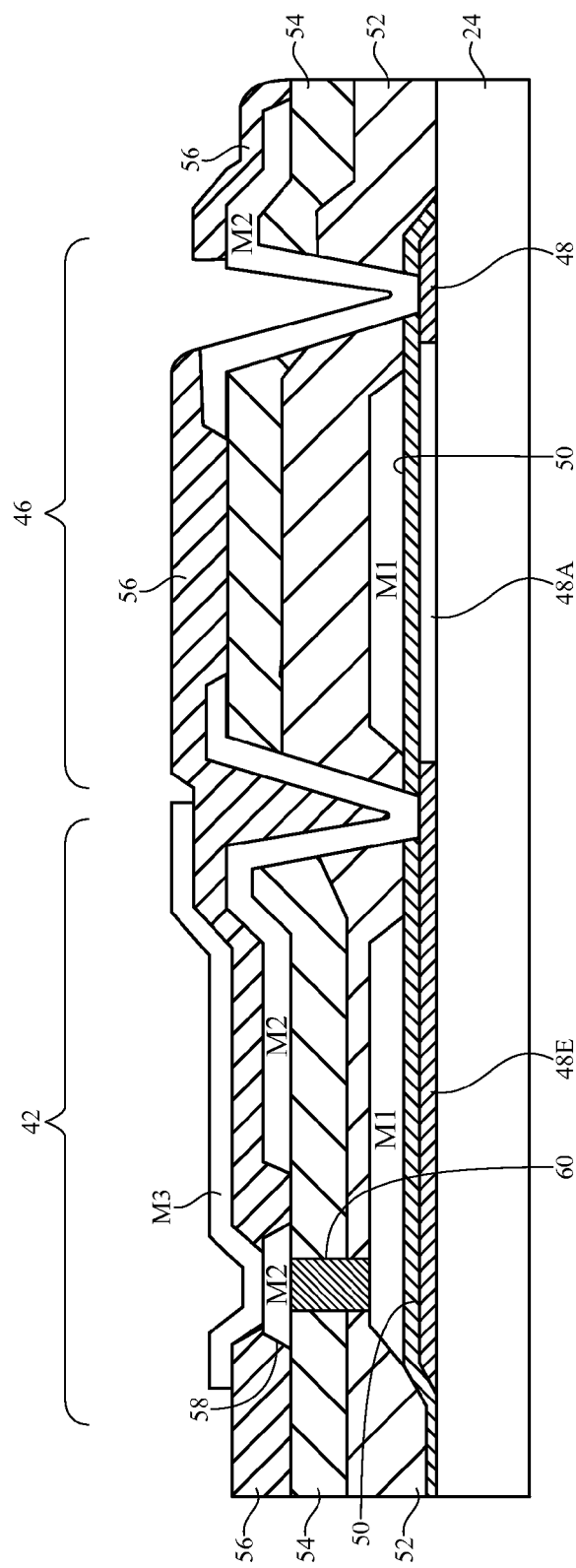
FIG. 4 is a cross-sectional side view of illustrative structures that may be used in implementing a thin-film transistor and in implementing a capacitor of the type shown in FIG. 3 in accordance with an embodiment.

Capacitor 42 may be fabricated from the layers of material that are patterned and deposited on substrate 24 as part of the process of forming thin-film transistors and other structures for display pixels 22. A cross-sectional side view of a portion of display 14 including illustrative structures for implementing capacitor 42 is shown in FIG. 4. As shown in FIG. 4, thin-film structures for forming one or more capacitors such as capacitor 42 and one or more thin-film transistors such as thin-film transistor 46 may be patterned and deposited on substrate 24.

Capacitor 42 and thin-film transistor 46 may be formed using respective portions of a common semiconductor layer 48. Semiconductor layer 48, which may sometimes be referred to as an active area, may be formed from a semiconductor such as polysilicon, indium gallium zinc oxide, amorphous silicon, or other semiconducting material. In region 48A, semiconductor layer 48 may be a lightly doped or undoped (intrinsic) region that forms a channel for transistor 46. Portion 48E of layer 48 may be heavily doped to form a conducting electrode for capacitor 42.

Gate insulator layer 50 may be deposited on top of semiconductor layer 48. Gate insulator may be formed from a dielectric such as silicon oxide. Metal layer M1, which may sometimes be referred to as forming a first metal layer on substrate 24, may be formed on top of gate insulator layer 50. In transistor 46, metal layer M1 forms a metal gate for transistor 46. In capacitor 42, metal layer M1 forms a capacitor electrode structure.

Metal layer M1 may be covered with first interlayer dielectric (ILD) layer 52 and second interlayer dielectric layer 54. Layers 52 and 54 may be formed from a dielectric such as silicon oxide, silicon nitride, other inorganic dielectrics or combinations of inorganic dielectrics, polymer, etc. Metal layer M2, which may sometimes be referred to as forming a second metal layer, may be formed on top of dielectric layer 54. In transistor 46, metal layer M2 is used in forming source and drain electrodes. In capacitor 42, metal layer M2 is used in forming capacitor electrode structures.

Passivation layer 56 (e.g. silicon nitride, silicon oxide, other inorganic dielectric materials, or other suitable dielectric) may be formed on top of metal layer M2. Metal layer M3, which may sometimes be referred to as a third metal layer, may be formed on top of passivation dielectric layer 56.

As shown in FIG. 4, metal layer M1 may be shorted to metal layer M3 using vertical metal connections. For example, an opening may be formed in passivation layer 56 that allows metal M3 to contact portion (island) 58 of metal layer M2 through passivation layer 56. Portion 58 of metal layer M2 may, in turn, be shorted to metal layer M1 using interlayer dielectric via 60 (i.e., conductive material in an opening formed from a lower opening in dielectric layer 52 and an upper opening in dielectric layer 54). The conductive material in via 60, metal M1, metal M2, and metal M3 may be formed from materials such as aluminum, copper, molybdenum, tungsten, gold, other metals, or combinations of these metals (as examples). Doped polysilicon and other conductive materials may also be used in forming capacitor plates, vertical interconnections, and other conductive structures for display 14, if desired.

Figure 5:
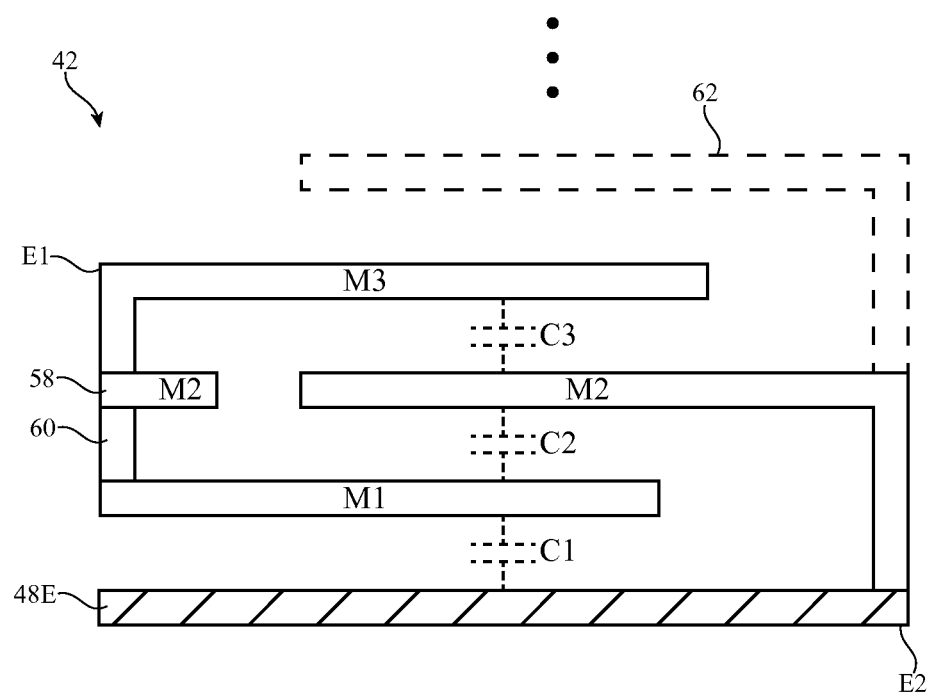
FIG. 5 is a cross-sectional side view of illustrative conductive layers of the type shown in FIG. 4 being used to implement a capacitor of the type shown in FIG. 3 in accordance with an embodiment.

FIG. 5 is a cross-sectional side view of display structures in display 14 showing how structures of the type shown in FIG. 4 may form a capacitor such as capacitor 42 of FIG. 3. As shown in FIG. 5, capacitor 42 has a series of stacked interleaved conductive plates. The lowermost conductive plate is formed from semiconductor layer 48E. The next conductive plate is formed from a portion of metal layer M1 that overlaps semiconductor layer 48E. Via 60 and metal portion 58 in metal layer M2 connect metal layer M1 to an uppermost conductive plate in capacitor 42 (i.e., the metal plate formed from a portion of metal layer M3 that overlaps metal layer M2). Metal M2 forms a conductive plate that is interposed between uppermost metal plate M3 and the metal plate formed from metal layer M1. With this configuration, the metal plate formed from metal layer M1, which represents the lower of the two intermediate plates, is interposed between metal plate M2 (the upper of the two intermediate plates) and the conductive capacitor plate formed from semiconductor layer 48E.

There are therefore four interleaved and overlapping conductive plates in capacitor 42 of FIGS. 4 and 5. These stacked conductive capacitor plates are interconnected to form first capacitor electrode E1 and second capacitor electrode E2. The stacked plates give rise to parallel capacitances C1, C2, and C3 between electrodes E1 and E2. In particular, overlapping parallel plates M1 and plate 48E give rise to capacitance C1, overlapping parallel plates M2 and M1 give rise to capacitance C2, and overlapping parallel plates M2 and M3 give rise to capacitance C3. Dielectric separates each respective pair of overlapping plates in the stack. If desired, one or more, two or more, three or more, or four or more additional plates such as illustrative additional capacitor plate 62 can be stacked on top of the capacitor structures of FIG. 5 to provide capacitor 42 with additional capacitance. With this type of configuration, a first group of plates (e.g., odd-numbered conductive layers) may be shorted to the first capacitor electrode and a second group of plates (e.g., even numbered conductive layers) may be shorted to the second capacitor electrode. By using a stacked capacitor structure, the amount of capacitance that may be produced by capacitor 42 for a given surface area on substrate 24 can be enhanced, thereby enhancing display performance.

Figure 6:
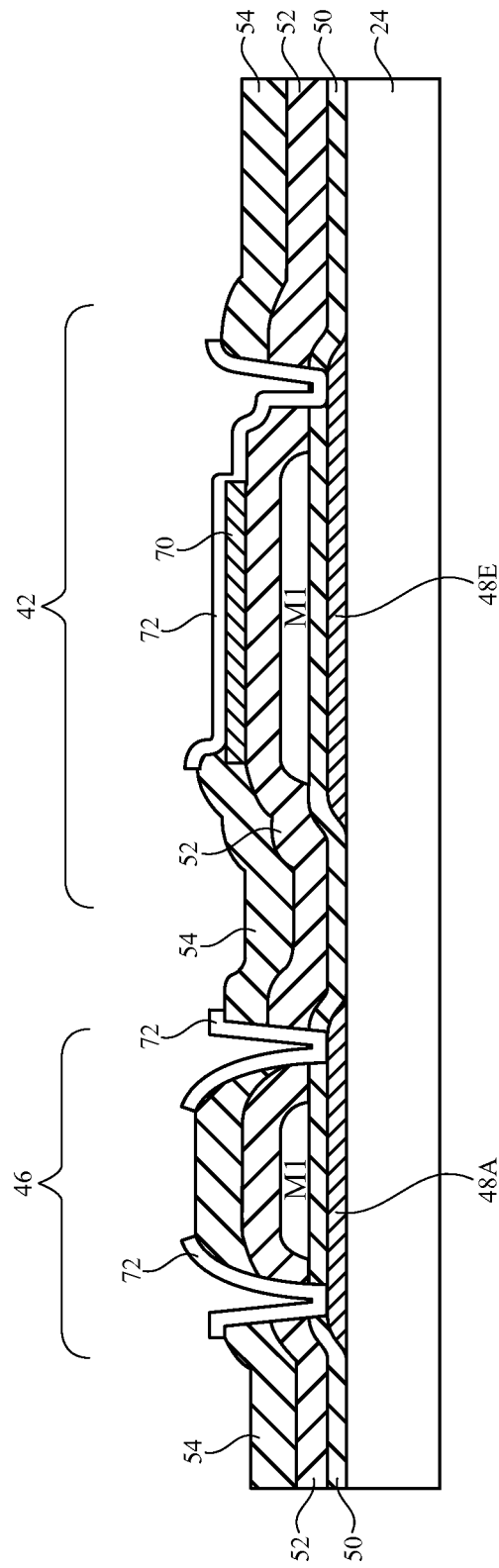
FIG. 6 is a cross-sectional side view of illustrative thin-film transistor structures and illustrative capacitor structures in accordance with an embodiment.

Another illustrative stacked capacitor configuration that may be used for forming capacitor 42 is shown in FIG. 6. As shown in FIG. 6, thin-film structures for forming one or more capacitors such as capacitor 42 and one or more thin-film transistors such as thin-film transistor 46 may be patterned and deposited on substrate 24 using shared layers of material such as shared conductive layers and dielectric layers.

Capacitor 42 and thin-film transistor 46 of FIG. 6 may use a common patterned semiconductor layer to form capacitor electrode 48E and transistor active area 48A. The semiconductor layer, which may sometimes be referred to as an active area layer, may be formed from a semiconductor such as polysilicon, indium gallium zinc oxide, or other semiconducting material. In region 48A, the semiconductor layer may be lightly doped or undoped to form a channel region for transistor 46. The gate for transistor 46 is formed from a portion of metal layer M1 that overlaps region 48A. Portion 48E of layer 48 may be heavily doped to form a conducting electrode for capacitor 42.

Gate insulator layer 50 may be deposited on top of the semiconductor layer that makes up portions 48E and 48A. Gate insulator layer 50 may be formed from a dielectric such as silicon oxide or other dielectric material. Metal layer M1, which may sometimes be referred to as forming a first metal layer on substrate 24, may be formed on top of gate insulator layer 50. In transistor 46, metal layer M1 forms the metal gate of transistor 46. In capacitor 42, metal layer M1 forms a capacitor electrode structure (i.e., one of a series of stacked interleaved capacitor plates).

Metal layer M1 may be covered with first interlayer dielectric (ILD) layer 52 and second interlay dielectric layer 54. Layers 52 and 54 may be formed from a dielectric such as silicon oxide, silicon nitride, other inorganic dielectrics, combinations of inorganic dielectrics, polymer, etc. Metal layer 72, which may sometimes be referred to as forming a source-drain metal layer, may be formed on top of dielectric layer 54. In transistor 46, metal layer 72 is used in forming source and drain electrodes connected to opposing ends of active area 48A. In capacitor 42, metal layer M2 is used in forming capacitor electrode structures. Metal layer 72 may overlap metal layer M1 and electrode 48E in a stacked plate configuration to form interleaved plates for capacitor 42.

Capacitance for capacitor 42 can be increased by minimizing the thickness of the dielectric that is interposed between respective plates. One illustrative way to minimize dielectric thickness involves etching away excess dielectric. To help control the depth to which dielectric etching extends when etching through layers 52 and 54 and thereby prevent plate 72 in capacitor 42 from possibly shorting to the capacitor plate formed from metal M1, an etch stop structure may be formed in capacitor 42. As shown in FIG. 6, for example, layer 70 may be formed on top of interlayer dielectric 52. By forming layer 70 on top of dielectric layer 52, etching can be stopped at the interface between layers 54 and 52, rather than inadvertently etching through layer 52 to underlying metal layer M1. Layer 70 may be formed from any suitable etch stop material such as metal. Metal layer 72 may be formed directly on top of layer 70 and may be electrically connected (shorted) to layer 70 (i.e., layers 70 and 72 may together form one of the capacitor plates in capacitor 42). The use of an etch stop layer such as layer 70 that is interposed between metal 72 and dielectric layer 52 may allow the thickness of the dielectric that is interposed between metal layer 72 and metal layer M1 in capacitor 42 to be minimized, thereby helping to enhance capacitance for capacitor 42.

Figure 7:
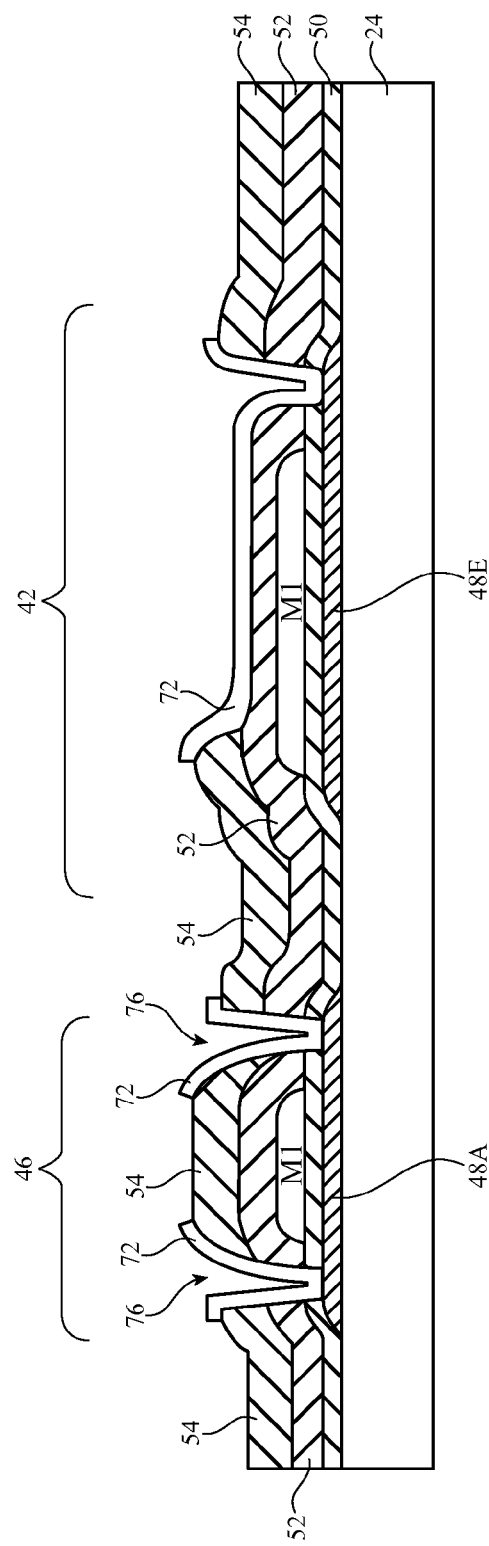
FIG. 7 is a cross-sectional side view of additional illustrative thin-film transistor structures and capacitor structures in accordance with an embodiment.

An alternative capacitor configuration is shown in FIG. 7. With the illustrative configuration of FIG. 7, no etch stop layer is interposed between metal layer 72 and dielectric layer 54. This avoids the use of an extra photolithographic mask during fabrication. To avoid using an extra mask (i.e., a mask for forming patterned etch stop layer 70 of FIG. 6), a half-tone photolithographic mask is used during fabrication. By using a half-tone mask, the rate of etching of the dielectric that makes up layers 52 and 54 in the portion of capacitor 42 under metal layer 72 may be half as much as the rate of etching of layers 52 and 54 when forming source and drain vias 76 to contact active layer 48A. In vias 76, dielectric etching is sufficiently fast to pass through two layers: layers 52 and 54. In the portion of capacitor 42 under metal 72, dielectric etching is about half as fast (as an example) due to the use of the half tone mask and passes only through upper dielectric layer 54 and not lower dielectric layer 52. As with the arrangement of FIG. 6, the thinned thickness of the dielectric between metal plate 72 and the metal plate formed from metal M1 helps to enhance the value of capacitance produced by capacitor 42.

Figure 8:
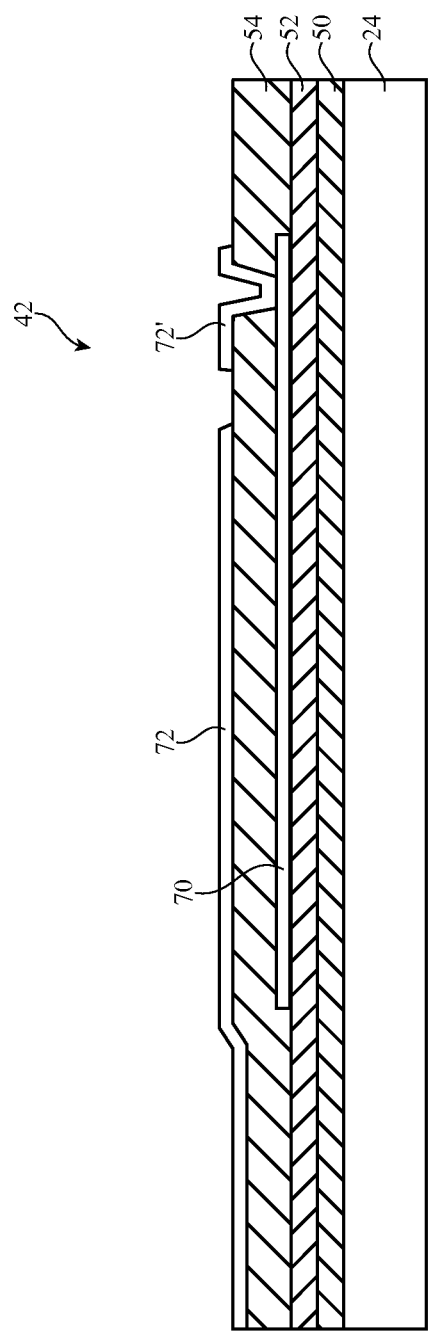
FIG. 8 is a cross-sectional side view of further illustrative structures that may be formed using a metal layer of the type used in forming an etch stop in the structures of FIG. 6 in accordance with an embodiment.

To prevent display driving signals such as signals routed into a touch module from being coupled into structures such as display pixel storage capacitor 42, it may be desirable to increase parasitic capacitances associated with the signal lines carrying those driving signals. FIG. 8 is a cross-sectional side view of a portion of display 14 showing how a layer of metal such as etch stop metal 70 of FIG. 6 may have portions that are incorporated under a portion of source-drain metal layer 72 that has been configured to form signal lines. This gives rise to a capacitance between metal 72 and metal 70. Connection 72' may be used to maintain metal layer 70 of FIG. 8 at a fixed voltage. The capacitance between metal 72 and metal 70 may be enhanced by forming dielectric layer 54 from one or more dielectrics with a high dielectric constant. As an example, layer 54 may include a 500 angstrom $SiN_x$ (silicon nitride) layer and a 1500 angstrom layer of a metal oxide such as $Ta_2O_5$ (dielectric constant 20), HfO (dielectric constant 30), or $Al_2O_3$ (dielectric constant 9.3). To ensure that parasitic capacitance between metal 72 and metal M1 is not too high, the thickness of dielectric layer 54 may be increased.

Display pixels 22 may have light shielding metal layers that help prevent light from interfering with the operation of the thin-film transistors of display pixels 22. If desired, light shielding metal may be used in forming a top gate thin-film transistor structure. The light shield metal layer can also be used in implementing a capacitor in display pixel 22. A cross-sectional side view of this type of structure is shown in FIG. 9.

Figure 9:
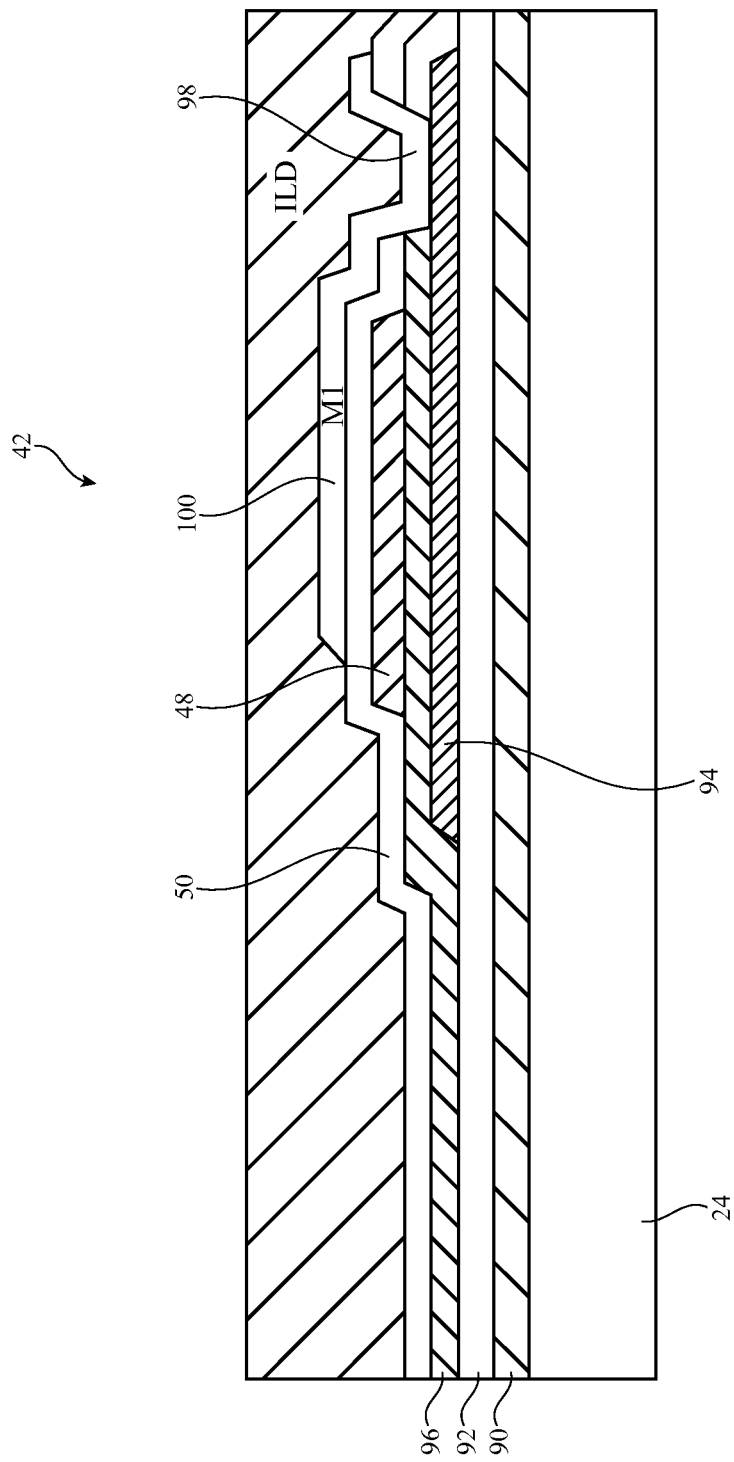
FIG. 9 is a cross-sectional side view of illustrative capacitor structures formed using part of a light shield layer in a display pixel in accordance with an embodiment.

As shown in FIG. 9, buffer layers such as buffer layers 90 and 92 may be formed on substrate 24. Substrate 24 may be a dielectric such as a polymer or other dielectric material (as an example). Layer 90 may be a dielectric layer such as a layer of silicon oxide, other inorganic dielectric, or other dielectric material. Layer 92 may be a dielectric layer such as a layer of silicon nitride, other inorganic dielectric, or other dielectric material. Light shield metal layer 94 may be formed on top of buffer layer 92. Light shield metal 94 may have portions that are patterned to prevent thin-film transistors on substrate 24 from being exposed to light that might otherwise generate carriers and affect the performance of the transistors. Buffer layer 96 may be interposed between semiconductor layer (active layer) 48 and light shield metal layer 94. Buffer layer 96 may be a dielectric such as silicon oxide and/or silicon nitride, other inorganic dielectric, or other dielectric materials.

Gate insulator layer 50 (e.g., a layer of silicon oxide or other dielectric material) may be formed over active layer 48. Metal layer M1 may have a portion such as portion 98 that forms a connection to light shield layer 94 and a portion such as portion 100 that overlaps semiconductor layer 48. Layers 100, 48, and 94 may form capacitor plates in a stacked interleaved capacitor configuration. The connection formed at portion 98 of metal M1 shorts metal plate 100 to metal plate 94 and forms a first capacitor terminal for capacitor 42 of FIG. 9. Interposed capacitor plate 48 forms a second capacitor terminal for capacitor 42.

The foregoing is merely illustrative and various modifications can be made by those skilled in the art without departing from the scope and spirit of the described embodiments. The foregoing embodiments may be implemented individually or in any combination.

What is claimed is:

1. A display pixel, comprising:
a drive transistor having a threshold voltage; and
threshold voltage compensation circuitry that compensates for variations in the threshold voltage, wherein the threshold voltage compensation circuitry comprises a thin-film transistor formed on a dielectric substrate and a capacitor having interleaved stacked conductive plates, wherein the interleaved stacked conductive plates include a semiconductor layer, a first metal layer, a first portion of a second metal layer, and a third metal layer, wherein the first metal layer is positioned between the semiconductor layer and the first portion of the second metal layer, and wherein the first metal layer is shorted to the third metal layer.

2. The display pixel defined in claim 1 further comprising a dielectric layer between the first metal layer and a second portion of the second metal layer and an opening in the dielectric layer, wherein the second portion of the second metal layer is patterned to form an island of metal, and wherein the first metal layer is shorted to the third metal layer by conductive material in the opening in the dielectric layer and the island of metal.

3. The display pixel defined in claim 2 further comprising a passivation layer interposed between the third metal layer and the first portion and the second portion of the second metal layer.

4. The display pixel defined in claim 3 wherein the passivation layer has an opening through which the third metal layer contacts the second portion of the second metal layer.

5. The display pixel defined in claim 1 wherein the thin-film transistor comprises an active area layer, a gate insulator on the active area layer, and a gate metal, wherein the gate insulator is interposed between the gate metal and the active area layer.

6. The display pixel defined in claim 5 wherein the active area layer in the thin-film transistor and the semiconductor layer in the capacitor are formed from a common layer of semiconductor material.

7. The display pixel defined in claim 6 wherein the semiconductor material comprises polysilicon.

8. The display pixel defined in claim 6 wherein the gate metal comprises a portion of the first metal layer.

9. A display pixel, comprising:
a drive transistor having a threshold voltage; and
threshold voltage compensation circuitry that compensates for variations in the threshold voltage, wherein the threshold voltage compensation circuitry comprises a thin-film transistor formed on a dielectric substrate and a capacitor having interleaved stacked conductive plates, the interleaved stacked conductive plates include a semiconductor layer, a first metal layer, a first portion of a second metal layer, and a third metal layer, wherein the thin-film transistor comprises an active area layer, a gate insulator on the active area layer, and a gate metal, the gate insulator is interposed between the gate metal and the active area layer, the gate metal is interposed between the active area layer and the first portion of the second metal layer, the active area layer comprising a channel, the gate metal overlapping the channel of the active area layer, the active area layer in the thin-film transistor and the semiconductor layer in the capacitor are formed from a common layer of semiconductor material, the gate metal comprises a portion of the first metal layer, and wherein the first portion and a second portion of the second metal layer form source and drain electrodes for the thin-film transistor.

10. A display pixel, comprising:
a drive transistor having a threshold voltage; and
threshold voltage compensation circuitry that compensates for variations in the threshold voltage, wherein the threshold voltage compensation circuitry comprises a thin-film transistor formed on a dielectric substrate and a capacitor having interleaved stacked conductive plates, wherein a first of the interleaved stacked conductive plates is formed from a semiconductor layer, wherein a second of the interleaved stacked conductive plates is formed from a first metal layer, wherein a third of the interleaved stacked conductive plates is formed from a first portion of a second metal layer and a third metal layer that is formed on top of a second portion of the second metal layer and is shorted to the second portion of the second metal layer, wherein at least a portion of a bottom surface of the third metal layer is in direct contact with a top surface of the second portion of the second metal layer, and wherein the first metal layer is positioned between the semiconductor layer and the first portion of the second metal layer.

11. The display pixel defined in claim 10 further comprising a first dielectric layer and a second dielectric layer on the first dielectric layer, wherein the first portion of the second metal layer in the capacitor comprises an etch stop on the first dielectric layer.

12. The display pixel defined in claim 11 wherein the semiconductor layer comprises polysilicon and wherein the capacitor further comprises an insulator layer between the polysilicon in the semiconductor layer and the first metal layer.

13. The display pixel defined in claim 12 wherein the insulator layer forms a gate insulator in the thin-film transistor.

14. The display pixel defined in claim 13 wherein the thin-film transistor has source and drain terminals formed from the first portion and a third portion of the second metal layer, respectively.

15. A display pixel, comprising:
a drive transistor having a threshold voltage; and
threshold voltage compensation circuitry that compensates for variations in the threshold voltage, wherein the threshold voltage compensation circuitry comprises a thin-film transistor formed on a dielectric substrate and a capacitor having interleaved stacked conductive plates formed from a semiconductor layer, a first metal layer, and a second metal layer, wherein the threshold voltage compensation circuitry comprises a first dielectric layer, a second dielectric layer on the first dielectric layer, and an opening that passes through the second dielectric layer, wherein a first portion of the second metal layer forms a capacitor plate for the capacitor and is located on the first dielectric layer within the opening that passes through the second dielectric layer, at least a portion of a bottom surface of a second portion of the second metal layer directly contacts a top surface of the semiconductor layer, and the first metal layer is shorted to the first portion of the second metal layer, and the first metal layer is positioned between the semiconductor layer and the second portion of the second metal layer.

16. The display pixel defined in claim 15 wherein the semiconductor layer comprises polysilicon and wherein the capacitor further comprises an insulator layer between the polysilicon in the semiconductor layer and the first metal layer.

17. The display pixel defined in claim 16 wherein the insulator layer forms a gate insulator in the thin-film transistor.

18. The display pixel defined in claim 17 wherein the thin-film transistor has source and drain terminals formed from the second portion and a third portion of the second metal layer, respectively.

19. The display pixel defined in claim 1, further comprising:
an organic light-emitting diode, wherein the drive transistor applies a current to the organic light-emitting diode.

* * * * *

UNITED STATES PATENT AND TRADEMARK OFFICE
CERTIFICATE OF CORRECTION

PATENT NO. : 9,647,048 B2  
APPLICATION NO. : 14/315202  
DATED : May 9, 2017  
INVENTOR(S) : Shih Chang Chang et al.

Page 1 of 1

It is certified that error appears in the above-identified patent and that said Letters Patent is hereby corrected as shown below:

In Claim 15, Column 11, Line 23, replace "semiconductor layer, and the first metal layer is shorted" with "semiconductor layer, the first metal layer is shorted"

Signed and Sealed this  
Fifteenth Day of August, 2017

Joseph Matal  
*Performing the Functions and Duties of the*  
*Under Secretary of Commerce for Intellectual Property and*  
*Director of the United States Patent and Trademark Office*